US012768872B2

(12) United States Patent
Choi et al.

(10) Patent No.: US 12,768,872 B2
(45) Date of Patent: Oct. 20, 2026

(54) SERIES ARC-FAULT DETECTION APPARATUS AND METHOD

(71) Applicant: Electronics and Telecommunications Research Institute, Daejeon (KR)

(72) Inventors: Won Kyu Choi, Daejeon (KR); Se Han Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 452 days.

(21) Appl. No.: 18/518,712

(22) Filed: Nov. 24, 2023

(65) Prior Publication Data

US 2024/0175911 A1 May 30, 2024

(30) Foreign Application Priority Data

Nov. 28, 2022 (KR) ........................ 10-2022-0161944

(51) Int. Cl.
*G01R 31/08* (2020.01)
*G06F 18/241* (2023.01)

(52) U.S. Cl.
CPC ......... *G01R 31/088* (2013.01); *G06F 18/241* (2023.01)

(58) Field of Classification Search
CPC .. G01R 31/088; G01R 31/1272; G01R 31/52; G01R 19/25; G01R 23/165; G01R 31/085; G01R 31/14; G06F 18/241; G06N 5/04; G06N 20/00
See application file for complete search history.

(56) References Cited

U.S. PATENT DOCUMENTS

| | | | | |
|---|---|---|---|---|
| 7,205,772 | B2 * | 4/2007 | Naidu | H02H 1/0015 324/536 |
| 8,599,523 | B1 * | 12/2013 | Ostrovsky | H02H 3/16 361/45 |
| 10,283,956 | B2 | 5/2019 | Parker et al. | |
| 11,556,789 | B2 * | 1/2023 | Gugulothu | G06N 3/0442 |
| 2008/0157781 | A1 | 7/2008 | Mason et al. | |
| 2018/0351342 | A1 * | 12/2018 | Anderson | H02H 3/331 |
| 2022/0180152 | A1 | 6/2022 | Lee | |

(Continued)

FOREIGN PATENT DOCUMENTS

| | | | |
|---|---|---|---|
| JP | 6116495 | B2 | 4/2017 |
| KR | 10-2008-0063128 | A | 7/2008 |

(Continued)

OTHER PUBLICATIONS

The translation of KR102284958 specification will be provided. (Year: 2021).*

*Primary Examiner* — Manuel A Rivera Vargas
(74) *Attorney, Agent, or Firm* — LRK PATENT LAW FIRM

(57) ABSTRACT

The present invention relates to a series arc-fault detection apparatus and method, and the series arc-fault detection apparatus according to some embodiments of the present invention includes a signal processing unit configured to generate signal data for estimation by a deep learning inference model by signal-processing a current signal detected by a current transformer and an inference unit configured to estimate whether an arc-fault occurs based on the deep learning inference model through the signal data generated by the signal processing unit.

16 Claims, 8 Drawing Sheets

(56) References Cited

U.S. PATENT DOCUMENTS

| | | | | |
|---|---|---|---|---|
| 2022/0187262 | A1 | 6/2022 | Jang et al. | |
| 2022/0252679 | A1 | 8/2022 | Kaiser et al. | |
| 2022/0368614 | A1 * | 11/2022 | Lee | G06F 18/2155 |
| 2024/0127630 | A1 * | 4/2024 | Michaeli | G06V 40/172 |

FOREIGN PATENT DOCUMENTS

| | | | | |
|---|---|---|---|---|
| KR | 10-2014-0043223 | A | 4/2014 | |
| KR | 10-1692283 | B1 | 1/2017 | |
| KR | 10-2021-0059322 | A | 5/2021 | |
| KR | 102284958 | B1 * | 8/2021 | G01R 31/62 |
| KR | 10-2022-0145582 | A | 10/2022 | |
| KR | 10-2454527 | B1 | 10/2022 | |

* cited by examiner (a)

SERIES ARC-FAULT DETECTION APPARATUS AND METHOD

CROSS-REFERENCE TO RELATED APPLICATION

This application claims priority to and the benefit of Korean Patent Application No. 10-2022-0161944, filed on Nov. 28, 2022, the disclosure of which is incorporated herein by reference in its entirety.

BACKGROUND

1. Field of the Invention

The present invention relates to a series arc-fault detection apparatus and method, and more specifically, to a series arc-fault detection apparatus and method for detecting a series arc-fault based on a deep learning model.

2. Description of Related Art

Most traditional livestock farms are spaces with a high fire risk due to aging electrical equipment and wires.

Most causes of fires in livestock farms are electrical leaks or short circuits due to old indoor wiring, and overload due to exceeding the rated capacity, and especially various types of arc-faults that occur in old electrical wiring. Arc-faults that may occur in electrical wiring are divided into series arc-faults and parallel arc-faults.

A parallel arc-fault signal has features clearly different from a normal current signal, and accordingly, is easy to distinguish. However, a series arc-fault signal sometimes has features that are not clearly different from the normal current signal, and accordingly, is difficult to detect with a general hardware-based detector.

Arc-fault detectors in the related art are expensive and have very low detection accuracy compared to earth leakage circuit breakers. In addition, the arc-fault detectors in the related art have a higher probability of malfunction because their sensitivity is more sensitive than that of earth leakage circuit breakers. That is, in the related art, electric fires may be greatly prevented by installing arc-fault detectors, but since arc-fault detectors are expensive and have low arc-fault detection reliability, it is difficult to expect voluntary installation of the arc-fault detectors.

SUMMARY OF THE INVENTION

The present invention is directed to providing a series arc-fault detection apparatus and method for extracting features of an arc-fault signal for each load in a time domain and a frequency domain by inputting the arc-fault signal into a deep learning model, and estimating a series arc-fault signal and a load where the series arc-fault signal has occurred based on the extracted features.

According to an aspect of the present invention, there is provided a series arc-fault detection apparatus including a signal processing unit configured to generate signal data for estimation by a deep learning inference model by signal-processing a current signal detected by a current transformer and an inference unit configured to estimate whether an arc-fault occurs based on the deep learning inference model through the signal data generated by the signal processing unit.

In some embodiments of the present invention, the signal processing unit may include a filtering unit configured to remove noise components of a current detected by the current transformer, a variable amplifier configured to amplify a current signal filtered by the filtering unit, an analog-to-digital converter (ADC) configured to convert the current signal amplified by the variable amplifier into a digital signal, and a storage unit configured to store the current signal converted by the ADC.

In some embodiments of the present invention, the variable amplifier may adjust a degree of amplification according to a control signal from the inference unit.

In some embodiments of the present invention, the inference unit may preprocess the signal data of the signal processing unit into time series data in a time domain and data in a frequency domain, extract signal features in the time domain and signal features in the frequency domain from the time series data in the time domain and the data in the frequency domain, respectively, through a deep learning model, and determine whether the current signal is a normal signal or an arc-fault signal by fusing the signal features in the time domain and the signal features in the frequency domain.

In some embodiments of the present invention, the inference unit may estimate a load where the arc-fault has occurred through a deep learning model depending on whether or not the arc-fault has occurred.

In some embodiments of the present invention, the inference unit may preprocess the signal data of the signal processing unit into time series data in a time domain and data in a frequency domain, extract load features of the current signal from the time series data in the time domain and the data in the frequency domain through a transfer deep learning model, and estimate a load where the arc-fault has occurred through the extracted load features.

In some embodiments of the present invention, the inference unit may be configured to calculate an arc-fault occurrence period by reducing a period of collecting signal data for the signal processing unit depending on whether the arc-fault has occurred.

According to another aspect of the present invention, there is provided an arc-fault detection method including preprocessing, by an inference unit, signal data of a signal processing unit into time series data in a time domain and data in a frequency domain, extracting, by the inference unit, each of signal features in the time domain and signal features in the frequency domain from the time series data in the time domain and the data in the frequency domain based on a deep learning model, and determining, by the inference unit, whether a current signal is a normal signal or an arc-fault signal by fusing the signal features in the time domain and the signal features in the frequency domain.

In some embodiments of the present invention, the arc-fault detection method may further include estimating, by the inference unit, a load where an arc-fault has occurred through a deep learning model depending on whether or not the arc-fault has occurred.

In some embodiments of the present invention, the estimating of the load where the arc-fault has occurred may include preprocessing, by the inference unit, the signal data of the signal processing unit into time series data in a time domain and data in a frequency domain and extracting, by the inference unit, load features of the current signal from the time series data in the time domain and the data in the frequency domain through a transfer deep learning model, and estimating a load where the arc-fault has occurred through the extracted load features.

In some embodiments of the present invention, the arc-fault detection method may further include calculating, by the inference unit, an arc-fault occurrence period by reducing a period of collecting signal data for the signal processing unit depending on whether the arc-fault has occurred.

According to still another aspect of the present invention, there is provided a series arc-fault detection method including generating, by a signal processing unit, signal data for estimation by a deep learning inference model by signal-processing a current signal detected by a current transformer and estimating, by an inference unit, whether an arc-fault occurs based on the deep learning inference model through the signal data generated by the signal processing unit.

In the generating of the signal data according to some embodiments of the present invention, the signal processing unit may remove noise components of a current detected by the current transformer and amplify the noise-removed current, convert the amplified current signal into a digital signal, and store the digital-converted signal.

In the generating of the signal data according to some embodiments of the present invention, the signal processing unit may adjust a degree of amplification according to a control signal from the inference unit.

In the estimating whether the arc-fault has occurred according to some embodiments of the present invention, the inference unit may preprocess the signal data of the signal processing unit into time series data in a time domain and data in a frequency domain, extract signal features in the time domain and signal features in the frequency domain from the time series data in the time domain and the data in the frequency domain, respectively, through a deep learning model, and determine whether the current signal is a normal signal or an arc-fault signal by fusing the signal features in the time domain and the signal features in the frequency domain.

In some embodiments of the present invention, the arc-fault detection method may further include estimating, by the inference unit, a load where an arc-fault has occurred through a deep learning model depending on whether or not the arc-fault has occurred.

In the estimating of the load where the arc-fault has occurred according to some embodiments of the present invention, the inference unit may preprocess the signal data of the signal processing unit into time series data in a time domain and data in a frequency domain, extract load features of the current signal from the time series data in the time domain and the data in the frequency domain through a transfer deep learning model, and estimate a load where the arc-fault has occurred through the extracted load features.

In some embodiments of the present invention, the arc-fault detection method may further include calculating, by the inference unit, an arc-fault occurrence period by reducing a period of collecting signal data for the signal processing unit depending on whether the arc-fault has occurred.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
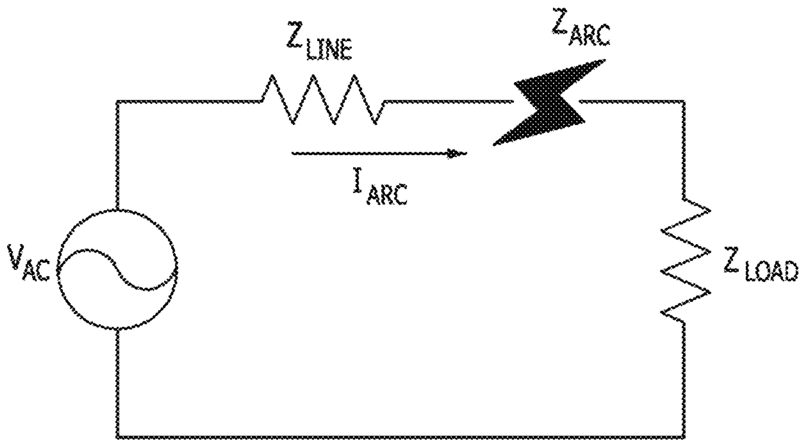
FIG. 1 is a conceptual diagram of series arc-fault occurrence.

Hereinafter, one example of a series arc-fault detection apparatus and method according to one embodiment of the present invention will be described. In the process, thicknesses of lines, dimensions of elements, and the like shown in the drawings may be exaggerated for clarity and convenience. Also, terms described below may be defined in consideration of functions in the present invention, and may be changed depending on the customary practice or the intention of a user or operator. Thus, definitions of such terms should be determined based on the overall content of the present specification.

FIG. 1 is a conceptual diagram of series arc-fault occurrence.

Referring to FIG. 1, a general electric circuit may be simply equivalent to a power supply $V_{AC}$, a load resistance $Z_{LOAD}$, and a wire resistance $Z_{LINE}$. When a wire is damaged by an external environment, a resistance value of the wire may increase. Due to this high resistance value, temperature of a damaged part of the wire rises very high, and the damaged part of the wire is carbonized due to the high heat, thereby causing a series arc-fault to occur, and thus an arc-fault current $I_{ARC}$ flows.

According to a circuit configuration, the series arc-fault current $I_{ARC}$ is generally smaller than a load current flowing in a load. Therefore, it is very difficult to detect the series arc-fault current $I_{ARC}$ based on a magnitude of the current using existing hardware.

Figure 2:
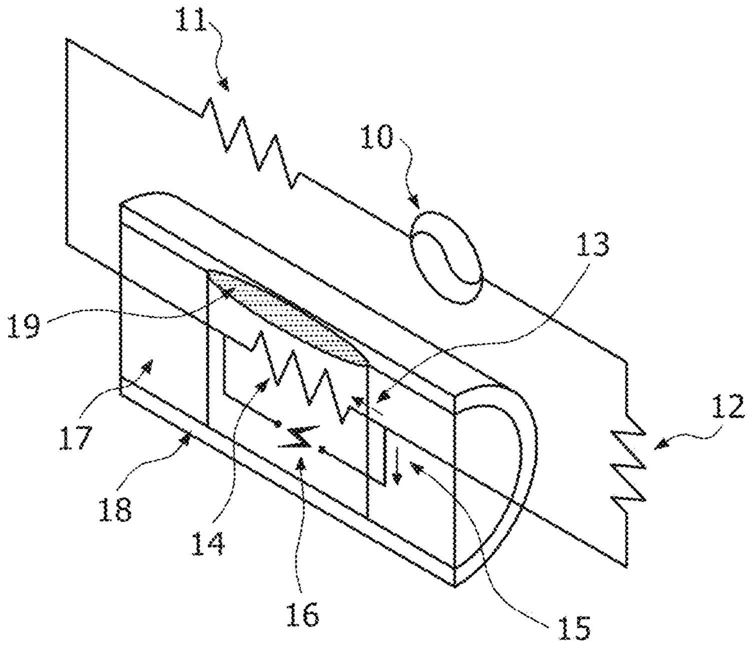
FIG. 2 is an equivalent circuit diagram of series arc-fault occurrence.

FIG. 2 is an equivalent circuit diagram of series arc-fault occurrence.

In general, an electric wire consists of a metal 17 and an insulator 18 surrounding the metal.

A voltage source 10 and a resistive load 12 are connected to the electric wire, allowing an appropriate current to flow. In addition, the wire has an internal resistance 11 depending on the characteristics of the metal 17.

When the electrical wire is damaged by an external environment, a high resistance component 14 is created at a damaged portion of the wire and thus high heat is generated. As high heat continues around the electric wire, a surrounding area thereof is carbonized, and a high voltage is applied to a carbonized portion 19, and thus an arc-fault 16 occurs.

As the arc-fault occurs in the damaged portion of the wire in this way, the current flowing in the wire may be divided into a current 13 flowing to the resistance component 14 equivalent to the damaged portion and a current 15 flowing to the arc-fault 16. Therefore, the series arc-fault current may not be greater than the magnitude of the current flowing in the resistive load 12.

Figure 3:
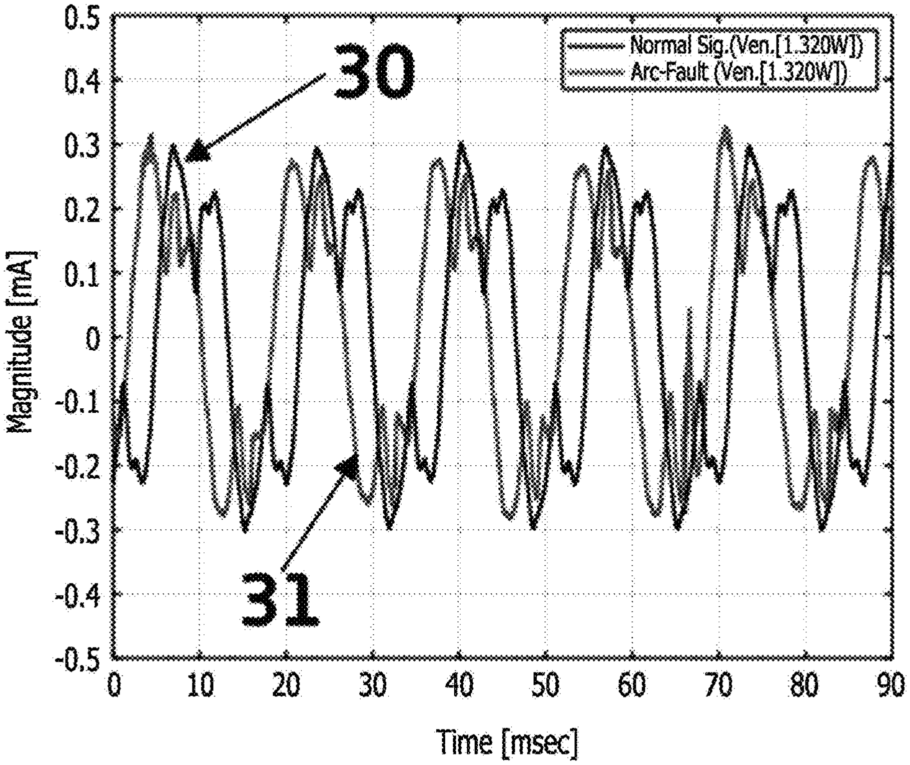
FIG. 3 is exemplary diagrams of series arc-fault signals depending on loads.

FIG. 3 is exemplary diagrams of series arc-fault signals depending on loads.

In FIG. 3, (*a*) shows a normal signal (black) 30 and a series arc-fault signal (red) 31 when a ventilator is used as a load.

The normal signal 30 and the arc-fault signal 31 show almost the same waveform except for slight distortion in peak portions of the signals.

In FIG. 3, (*b*) shows a normal signal (black) 32 and a series arc-fault signal (red) 33 when a fluorescent lamp is used as a load.

The arc-fault signal 33 has a strong noise component between peaks of the signal.

In FIG. 3, (*c*) shows a normal signal (black) 34 and a series arc-fault signal (red) 35 when a heating lamp is used as a load.

The arc-fault signal 35 is almost identical to the normal signal 34 except that some noise occurs in the peak portion of the signal.

In FIG. 3, (*d*) shows a normal signal (black) 36 and a series arc-fault signal (red) 37 when an incandescent lamp is used as a load.

The arc-fault signal 37 contains some noise compared to the normal signal 36. Referring to FIG. 3 (*a*) to (*d*), it may be difficult to distinguish between normal signals and arc-fault signals using general hardware or signal processing technology.

Therefore, a series arc-fault detection apparatus 100 according to one embodiment of the present invention utilizes feature data of the series arc-fault signal for each load for deep learning model training.

The series arc-fault detection apparatus 100 according to one embodiment of the present invention extracts features of time series data of the arc-fault signal by extracting feature data of the series arc-fault signal in a situation of various loads and power consumption by the loads. In this case, algorithms such as a one-dimensional convolution neural network (1D CNN), a long short-term memory (LSTM), or the like, may be used, and various classification algorithms may be used to check whether an arc-fault occurs and classify a load where the arc-fault has occurred.

Based on the deep learning model trained on features of the series arc-fault signal, the series arc-fault detection apparatus 100 according to one embodiment of the present invention may determine whether the arc-fault has occurred with high accuracy and may estimate an arc-fault occurrence situation based on accumulated data.

In addition, the series arc-fault detection apparatus 100 according to one embodiment of the present invention periodically collects a current signal flowing in the load in a set period, for example, in one period unit and monitors the arc-fault occurrence situation. When it is estimated that an arc-fault signal has occurred as a result of monitoring, the series arc-fault detection apparatus 100 according to one embodiment of the present invention monitors the arc-fault occurrence situation by reducing the data collection period for the signal and calculates an arc-fault occurrence period based on the monitoring.

Figure 4:
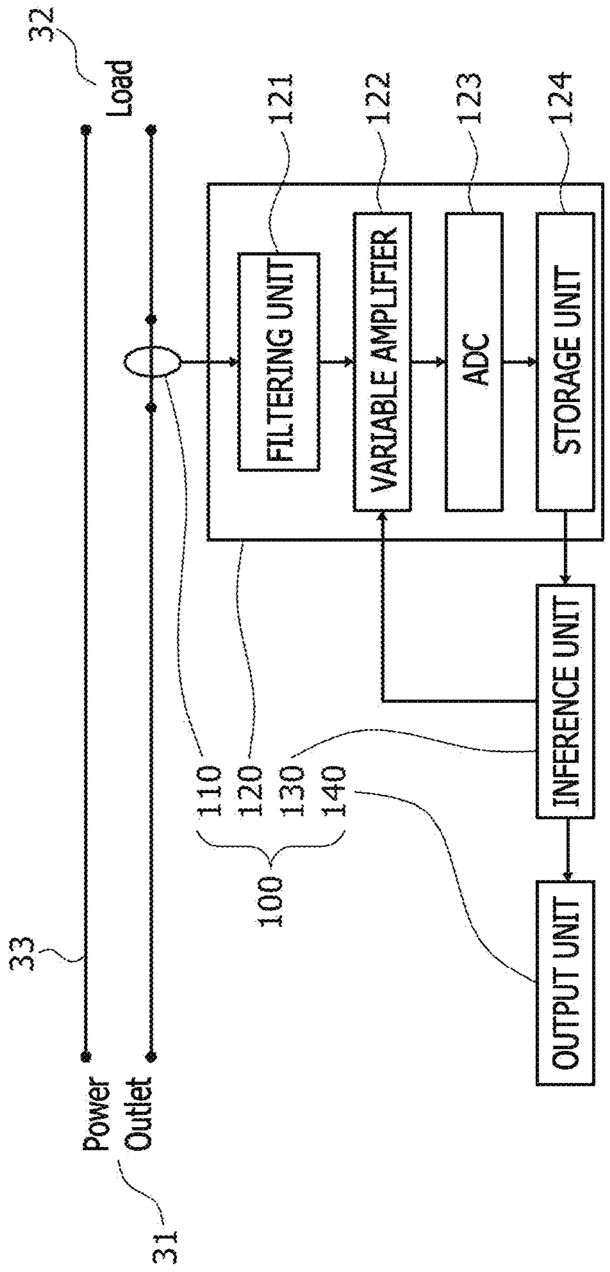
FIG. 4 is a block diagram of a series arc-fault detection apparatus according to one embodiment of the present invention.

FIG. 4 is a block diagram of the series arc-fault detection apparatus according to one embodiment of the present invention.

Referring to FIG. 4, the series arc-fault detection apparatus 100 according to one embodiment of the present invention includes a current transformer 110, a signal processing unit 120, an inference unit 130, and an output unit 140.

An electric wire 33 connects a power outlet 31 and a load 32 and supplies electric power to the load 32.

The current transformer 110 is installed on the electric wire 33 and detects features of a current signal.

The signal processing unit 120 generates signal data for estimation by a deep learning inference model by signal-processing the current signal detected by the current transformer 110.

The signal processing unit 120 includes a filtering unit 121, a variable amplifier 122, an analog-to-digital converter (ADC) 123, and a storage unit 124.

The filtering unit 121 removes noise components of the current signal input from the current transformer 110. The filtering unit 121 may remove noise components of 1 [MHz] or more of the current signal input from the current transformer 110. The filtering unit 121 may be a low pass filter, but is not particularly limited.

The variable amplifier 122 amplifies the size of the current signal filtered by the filtering unit 121 to a signal size suitable for estimation by the deep learning inference model of the inference unit 130.

The variable amplifier 122 adjusts the degree of amplification according to a control signal from the inference unit 130 according to the size of the current signal. The variable amplifier 122 adjusts the size of the current signal by adjusting the degree of amplification.

The ADC 123 converts the current signal amplified by the variable amplifier 122 into a digital signal.

The storage unit 124 stores signal data converted into the digital signal by the ADC 123. The storage unit 124 transmits the stored signal data to the inference unit 130.

The inference unit 130 estimates whether an arc-fault has occurred and a load where the arc-fault has occurred based on the deep learning model.

The inference unit 130 is an embedded board with the deep learning model for estimating whether an arc-fault has occurred, and reads signal data of a current signal in one period, which is to be used as an input to the deep learning inference model, from the storage unit 124.

With this signal data, the inference unit 130 estimates whether the arc-fault has occurred and the load where the arc-fault has occurred using a deep learning model, and calculates the arc-fault occurrence period by monitoring an arc-fault occurrence situation by reducing the data collection period depending on whether or not the arc-fault has occurred.

Figure 5:
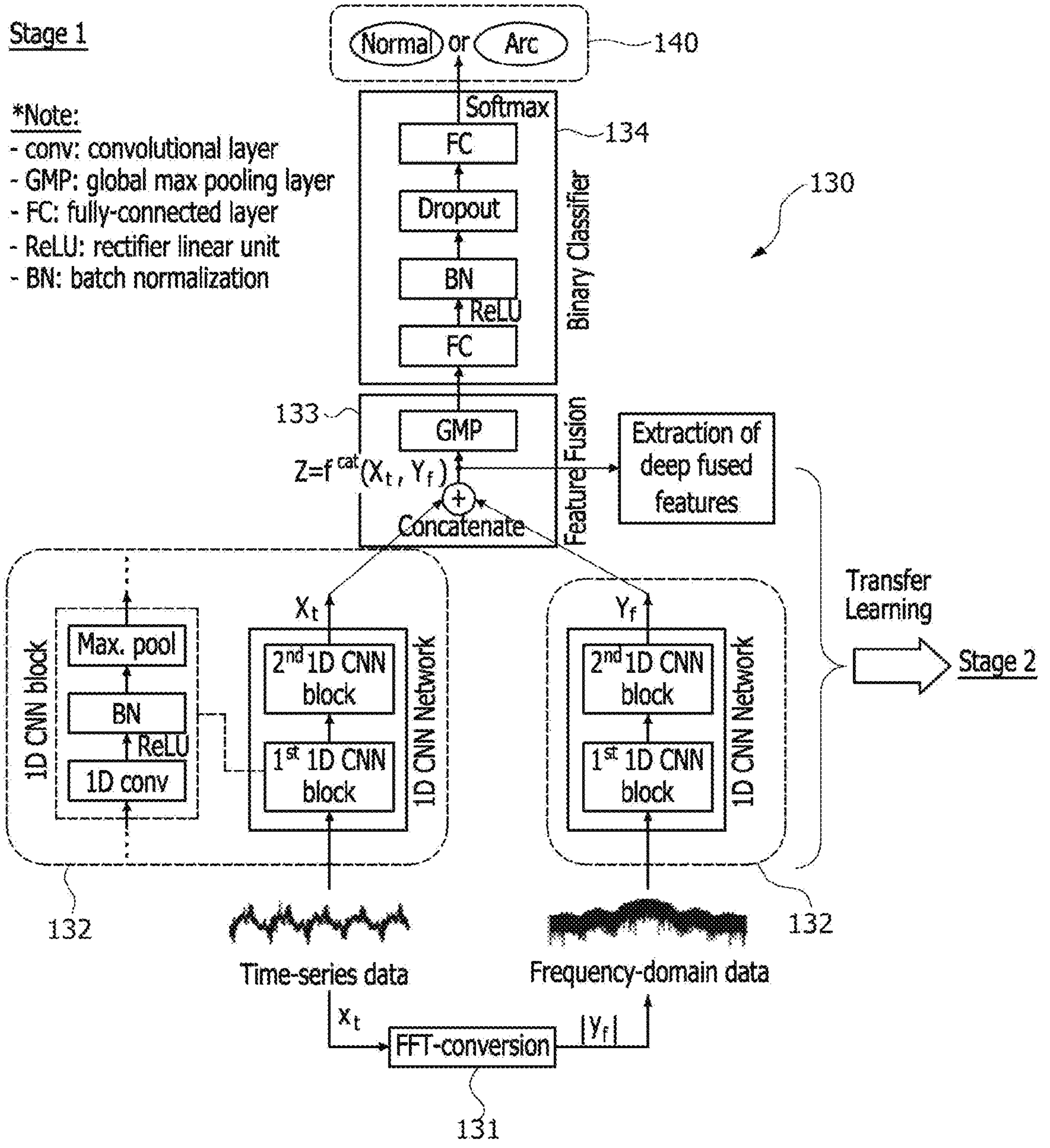
FIG. 5 is a diagram showing a deep learning model for extracting series arc-fault features of the series arc-fault detection apparatus according to one embodiment of the present invention.

FIG. 5 is a diagram showing a deep learning model for extracting series arc-fault features of the series arc-fault detection apparatus according to one embodiment of the present invention.

Referring to FIG. 5, based on a deep learning model structure of the inference unit 130, features of a current flowing in a wire may be classified as features of a normal-state signal or features of an arc-fault signal.

In the deep learning model in FIG. 5, data of the current flowing in the wire 33 is preprocessed into time series data in a time domain and data in a frequency domain that is obtained by transforming the time series data through fast Fourier transform (FFT) using an FFT converter 131.

Signals of the preprocessed time series data in the time domain and data in the frequency domain are input to a one-dimensional convolution neural network (1D CNN) layer 132.

As each of the time series data in the time domain and the input data in the frequency domain passes through the ID CNN layer 132, features of the current signal are extracted.

A fusion layer 133 fuses signal features in the time domain and signal features in the frequency domain.

A binary classification layer 134 determines whether the current signal is a normal signal or an arc-fault signal based on the signal features in the time domain and the signal features in the frequency domain, which are fused in the fusion layer 133, and outputs a determination result to the output unit 140.

Each of the ID CNN layer 132 and the fusion layer 133 trained in FIG. 5 may be transferred and used as an input layer of the deep learning model for estimating a load where the arc-fault signal has occurred.

Figure 6:
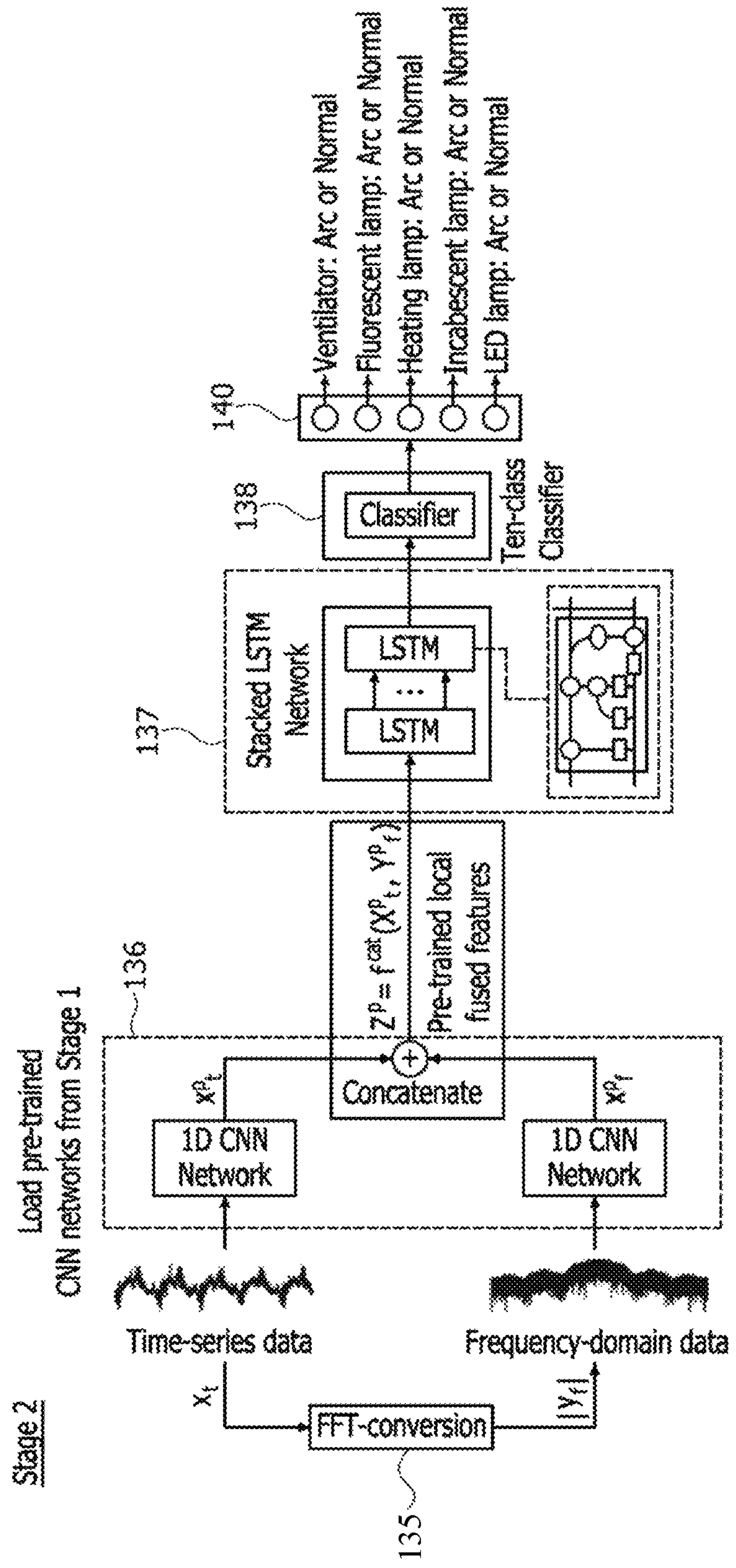
FIG. 6 is a diagram showing a deep learning model for estimating a load where an arc-fault has occurred according to one embodiment of the present invention.

FIG. 6 is a diagram showing a deep learning model for estimating a load where an arc-fault has occurred according to one embodiment of the present invention.

Referring to FIG. 6, the time series data in the time domain for the signal flowing in the wire 33 and the data in the frequency domain that is obtained by transforming the time series data through FFT by an FFT converter 135 are input to a transfer layer 136.

The transferred ID CNN layer 132 and fusion layer 133 for extracting the features of the current signal flowing in the wire 33 in FIG. 5 correspond to the transfer layer 136 in FIG. 6. That is, the transfer layer 53 in FIG. 6 includes the ID CNN layer 132 and the fusion layer 133 in FIG. 5.

In FIG. 6, the time series data in the time domain and the data in the frequency domain that is obtained by transforming the time series data through fast Fourier transform (FFT) are input to the transfer layer 136.

An output of the transfer layer 53 is input to a feature extraction layer (long short-term memory (LSTM)) 137 for extracting load features of the current signal.

The feature extraction layer 137 receives the output of the transfer layer 53 and extracts the load features of the current signal.

A decimal classification layer 138 receives a signal for extracting the load features of the current signal from the feature extraction layer 54, and estimates the load where the current signal (normal signal or arc-fault signal) has occurred.

With an output of the decimal classification layer 138, the load where the arc-fault signal has occurred may be estimated.

Meanwhile, the ID CNN layer 132 reduces the collection period of signal data when it is estimated that the arc-fault has occurred.

In general, arc-faults periodically occur. Therefore, when an arc-fault is first detected, the ID CNN layer 132 calculates the arc-fault occurrence period by reducing the period of collecting signal data and performing the arc-fault occurrence and load estimation operations as described above.

In addition, the ID CNN layer 132 may transmit a signal capable of controlling the degree of amplification of the variable amplifier 122 to the variable amplifier 122 when a size of signal data read from the storage unit 124 is small or large, so that the current signal is amplified by the variable amplifier 122 to a size suitable for deep learning inference.

The output unit 140 outputs occurrence or non-occurrence of the arc-fault from the inference unit 130. In addition, when the arc-fault has occurred, the output unit 140 outputs the load where the arc-fault has occurred.

Hereinafter, a serial arc-fault detection method according to one embodiment of the present invention will be described with reference to FIGS. 7 and 8.

Figure 7:
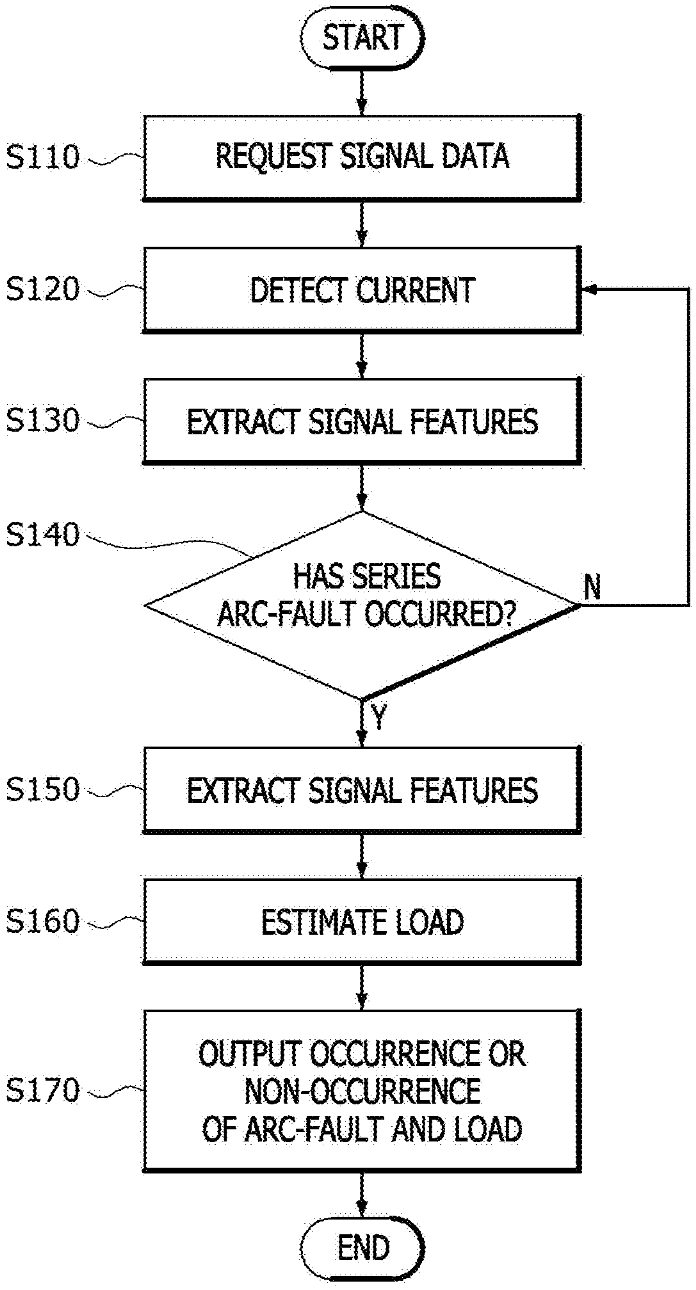
FIG. 7 is a flowchart showing a series arc-fault detection method according to one embodiment of the present invention.
Figure 8:
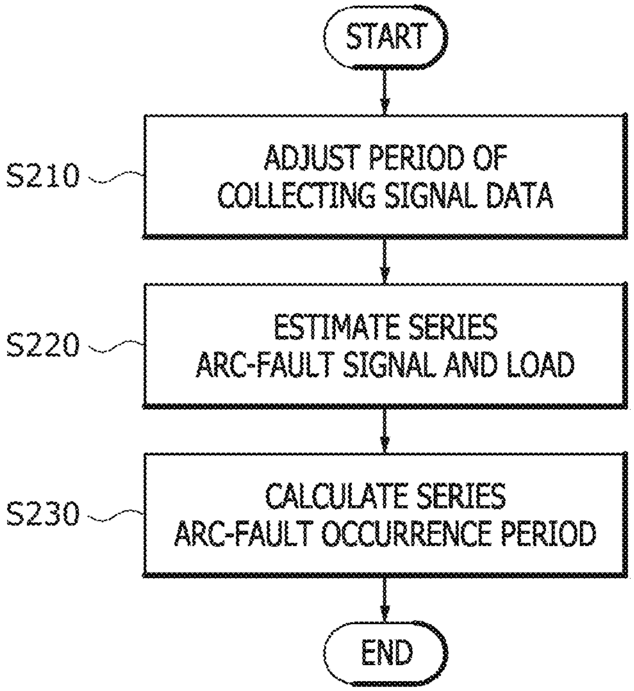
FIG. 8 is a flowchart showing a series arc-fault detection method according to another embodiment of the present invention.

FIG. 7 is a flowchart showing a series arc-fault detection method according to one embodiment of the present invention, and FIG. 8 is a flowchart showing a series arc-fault detection method according to another embodiment of the present invention.

Referring to FIG. 7, the inference unit 130 requests signal data from the signal processing unit 120 for analysis to determine whether an arc-fault has occurred (S110).

According to the signal data request, the current transformer 110 detects a current signal (S120).

The signal processing unit 120 processes and stores the current signal detected by the current transformer 110. In this case, the signal processing unit 120 transmits signal data of the most recently collected current signal in one period to the inference unit 130.

The inference unit 130 preprocesses the signal data received from the storage unit 124 into a signal in a time domain and a signal in a frequency domain. The inference unit 130 extracts primary features from the input signal preprocessed in the time domain and frequency domain using a deep learning algorithm or the like (S130).

The inference unit 130 fuses signal features in the time domain and signal features in the frequency domain, and determines whether the current signal is a normal signal or an arc-fault signal based on the fused signal features in the time domain and signal features in the frequency domain (S140).

When a determination result is that the current signal is a normal signal, the inference unit 130 requests signal data in another period from the signal processing unit 120 and repeats the feature extraction and arc-fault determination operations (S110, S120, S130).

On the other hand, when the current signal is an arc-fault signal, the inference unit 130 extracts load features of the signal using a deep learning algorithm (long short-term memory (LSTM)), deep neural network (DNN), or the like (S150). When secondary features of the current signal are extracted by the inference unit 130, a transferred deep learning model is used (transfer learning).

In this case, the inference unit 130 extracts the load features of the current signal and estimates a load where the arc-fault signal has occurred based on the extracted load features of the current signal (S160).

The output unit 140 outputs occurrence or non-occurrence of the arc-fault and the load where the arc-fault signal has occurred (S170).

Then, as shown in FIG. 8, the inference unit 130 requests signal data of a signal in another period from the signal processing unit 120 (S210). In this case, the inference unit 130 reduces the period of collecting signal data as shown in FIG. 8.

In this case, the inference unit 130 performs arc-fault occurrence and load estimation operations as shown in FIG. 7 based on signal data of a relatively short period (S220) and calculates an arc-fault occurrence period based on results of the operations (S230).

As used herein, the term "unit" may include a unit implemented in hardware, software, or firmware, and may interchangeably be used with other terms, for example, "logic," "logic block," "part," or "circuitry". A "unit" may be a single integral component, or a minimum unit or part thereof, adapted to perform one or more functions. For example, according to one embodiment, a module may be implemented in a form of an application-specific integrated circuit (ASIC). Further, implementations described herein may be implemented as, for example, a method or process, device, software program, data stream, or signal. Although discussed only in the context of a single form of implementation (e.g., discussed only as a method), implementations of the features discussed may also be implemented in other forms (e.g., devices or programs). A device may be implemented with appropriate hardware, software, firmware, etc. A method may be implemented in a device such as a processor or the like, which generally refers to a processing device including a computer, a microprocessor, an integrated circuit, a programmable logic device, or the like. Processors also include communication devices such as computers, cell phones, personal digital assistants ("PDAs") and other devices that facilitate communication of information between end users.

A series arc-fault detection apparatus and method according to the present invention can extract features of an arc-fault signal for each load in a time domain and a frequency domain by inputting the arc-fault signal into a deep learning model, and estimate a series arc-fault signal and a load where the series arc-fault signal occurs based on the extracted features.

In addition, the series arc-fault detection apparatus and method according to the present invention can determine and estimate the series arc-fault signal, which is one of the most important causes of fire accidents, with high accuracy and allow arc-fault detectors to be manufactured at a low price based on the accurate determination and estimation.

In addition, the series arc-fault detection apparatus and method according to the present invention can prevent electrical safety accidents caused by series arc faults in advance.

Although the present invention has been described with reference to the embodiments illustrated in the drawings, it is merely exemplary, and it is to be understood to those skilled in the art that various modifications and equivalent other embodiments could be made therefrom. Therefore, the technical protection scope of the present invention should be defined only by the claims.

What is claimed is:

1. A series arc-fault detection apparatus comprising:

a signal processing unit configured to generate signal data for estimation by a deep learning inference model by signal-processing a current signal detected by a current transformer; and an inference unit configured to estimate whether an arc-fault occurs based on the deep learning inference model through the signal data generated by the signal processing unit, wherein the signal processing unit includes:

a filtering unit configured to remove noise components of the current signal detected by the current transformer; and a variable amplifier configured to amplify the current signal filtered by the filtering unit, wherein the variable amplifier adjusts a degree of amplification according to a control signal from the inference unit.

2. The series arc-fault detection apparatus of claim 1, wherein the inference unit estimates a load where the arc-fault has occurred through a deep learning model depending on whether or not the arc-fault has occurred.

3. The series arc-fault detection apparatus of claim 2, wherein the inference unit preprocesses the signal data of the signal processing unit into time series data in a time domain and data in a frequency domain, extracts load features of the current signal from the time series data in the time domain and the data in the frequency domain through a transfer deep learning model, and estimates a load where the arc-fault has occurred through the extracted load features.

4. The series arc-fault detection apparatus of claim 1, wherein the signal processing unit further includes:

an analog-to-digital converter (ADC) configured to convert the current signal amplified by the variable amplifier into a digital signal; and a storage unit configured to store the current signal converted into the digital signal by the ADC.

5. The series arc-fault detection apparatus of claim 1, wherein the inference unit preprocesses the signal data of the signal processing unit into time series data in a time domain and data in a frequency domain, extracts signal features in the time domain and signal features in the frequency domain from the time series data in the time domain and the data in the frequency domain, respectively, through a deep learning model, and determines whether the current signal is a normal signal or an arc-fault signal by fusing the signal features in the time domain and the signal features in the frequency domain.

6. The series arc-fault detection apparatus of claim 1, wherein the inference unit calculates an arc-fault occurrence period by reducing a period of collecting signal data for the signal processing unit depending on whether the arc-fault has occurred.

7. A series arc-fault detection method comprising:

generating, by a signal processing unit, signal data by removing noise components of a current signal detected by a current transformer, and amplifying, by a variable amplifier, the current signal from which the noise components have been removed, wherein the variable amplifier adjusts a degree of amplification according to a control signal from an inference unit;

preprocessing, by the inference unit, the signal data generated by the signal processing unit into time series data in a time domain and data in a frequency domain;

extracting, by the inference unit, signal features in the time domain and signal features in the frequency domain from the time series data in the time domain and the data in the frequency domain based, respectively, on a deep learning model; and determining, by the inference unit, whether a current signal is a normal signal or an arc-fault signal by fusing the signal features in the time domain and the signal features in the frequency domain.

8. The series arc-fault detection method of claim 7, further comprising estimating, by the inference unit, a load where an arc-fault has occurred through a deep learning model depending on whether or not the arc-fault has occurred.

9. The series arc-fault detection method of claim 8, wherein the estimating of the load where the arc-fault has occurred includes:

preprocessing, by the inference unit, the signal data of the signal processing unit into time series data in a time domain and data in a frequency domain; and extracting, by the inference unit, load features of the current signal from the time series data in the time domain and the data in the frequency domain through a transfer deep learning model, and estimating a load where the arc-fault has occurred through the extracted load features.

10. The series arc-fault detection method of claim 7, further comprising calculating, by the inference unit, an arc-fault occurrence period by reducing a period of collecting signal data for the signal processing unit depending on whether the arc-fault has occurred.

11. A series arc-fault detection method comprising:

generating, by a signal processing unit, signal data for estimation by a deep learning inference model by signal-processing a current signal detected by a current transformer; and estimating, by an inference unit, whether an arc-fault occurs based on the deep learning inference model through the signal data generated by the signal processing unit, wherein in the generating of the signal data, the signal processing unit removes noise components of the current signal detected by the current transformer and amplifies the noise-removed current signal, and wherein the signal processing unit adjusts a degree of amplification according to a control signal from the inference unit.

12. The series arc-fault detection method of claim 11, further comprising estimating, by the inference unit, a load where the arc-fault has occurred through a deep learning model depending on whether or not the arc-fault has occurred.

13. The series arc-fault detection method of claim 12, wherein in the estimating of the load where the arc-fault has occurred, the inference unit preprocesses the signal data of the signal processing unit into time series data in a time domain and data in a frequency domain, extracts load features of the current signal from the time series data in the time domain and the data in the frequency domain through a transfer deep learning model, and estimates a load where the arc-fault has occurred through the extracted load features.

14. The series arc-fault detection method of claim 11, wherein in the generating of the signal data, the signal processing unit converts the amplified current signal into a digital signal, and stores the digital-converted signal.

15. The series arc-fault detection method of claim 11, wherein in the estimating whether the arc-fault has occurred, the inference unit preprocesses the signal data of the signal processing unit into time series data in a time domain and data in a frequency domain, extracts signal features in the time domain and signal features in the frequency domain from the time series data in the time domain and the data in the frequency domain, respectively, through a deep learning model, and determines whether the current signal is a normal signal or an arc-fault signal by fusing the signal features in the time domain and the signal features in the frequency domain.

16. The series arc-fault detection method of claim 11, further comprising calculating, by the inference unit, an arc-fault occurrence period by reducing a period of collecting signal data for the signal processing unit depending on whether the arc-fault has occurred.

* * * * *